United States Patent

Swerdlow

[15] 3,693,109

[45] Sept. 12, 1972

[54] PUSH-PULL FEED-FORWARD AMPLIFIER

[72] Inventor: Richard Barry Swerdlow, Haverhill, Mass.

[73] Assignee: Bell Telephone Laboratories, Incorporated, Murray Hill, N.J.

[22] Filed: Dec. 13, 1971

[21] Appl. No.: 207,085

[52] U.S. Cl. ......................330/81, 330/84, 330/118, 330/149, 330/151

[51] Int. Cl. ..............................................H03f 1/28

[58] Field of Search..........330/81, 84, 118, 149, 151; 328/163; 179/1 P; 325/474, 475

[56] References Cited

UNITED STATES PATENTS 1,795,393 3/1931 Herman.................325/475 X

*Primary Examiner*—Roy Lake
*Assistant Examiner*—James B. Mullins
*Attorney*—R. J. Guenther et al.

[57] ABSTRACT

A feed-forward amplifier is connected in a push-pull arrangement which includes rectifying means and cross-coupling means. The rectifying means and the cross-coupling arrangement eliminate the necessity for additional error-correction amplifiers to provide feed-forward compensation while the amplifier operates in a push-pull manner.

5 Claims, 1 Drawing Figure

10 FEED-FORWARD AMPLIFIER
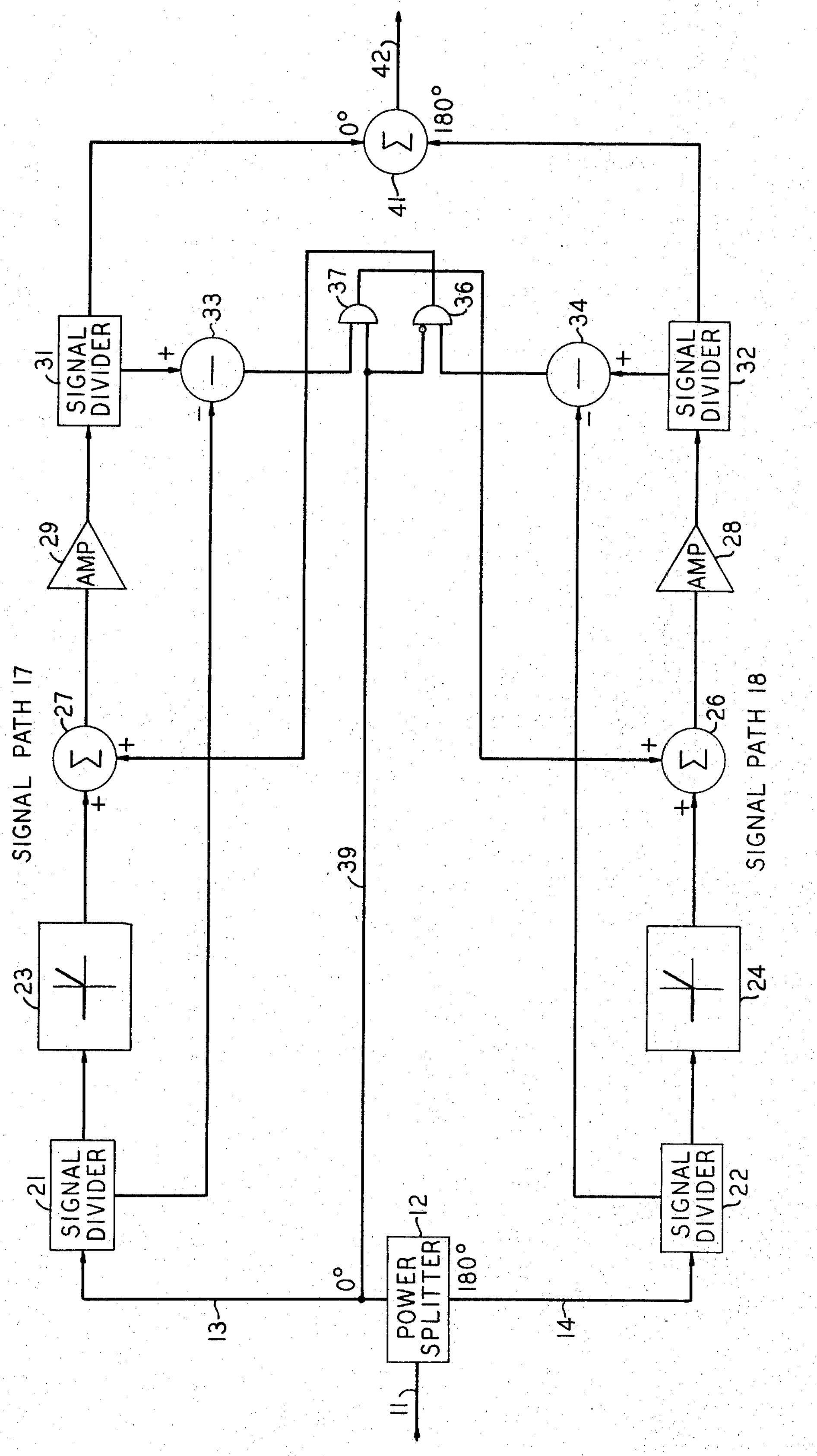

PUSH-PULL FEED-FORWARD AMPLIFIER

BACKGROUND OF THE INVENTION

This invention relates to high-power amplifiers and, more particularly, to high-power amplifiers which employ feed-forward techniques to eliminate a substantial amount of noise and distortion.

The utilization of feed-forward techniques heretofore, in most instances, has been applied to minimize noise and distortion in single-ended amplifiers. To obtain an error component which results from the noise and distortion produced by an amplifier, couplers located in the input and output circuits of this amplifier subtract a portion of the input signal from a portion of the amplified output signal. The resulting error component is applied to a subsidiary amplifier which amplifies the error component to the same level as the noise and distortion present in the output of the main signal amplifier. The amplified error component and the main output signal are combined in a manner such that the noise and distortion of the main output signal are canceled out to provide a faithful output signal.

In applications which require high-power, efficiency and fidelity, push-pull amplifiers are widely used since they offer performance superior to that of single-ended amplifiers. Moreover, the quality of reproduction of push-pull amplifiers has been further enhanced by utilization of feedback compensation at the expense of gain. Feed-forward compensation has been recognized as being capable of providing the same degree of fidelity without decreasing the gain, but the conventional utilization of feed-forward techniques in a push-pull amplifier would require at least one additional subsidiary amplifier. This fact has discouraged those skilled in the art from using feed-forward compensation. If an arrangement were provided which eliminated the requirement for an additional subsidiary amplifier, those working in the art would have a practical alternative to feedback compensation without a corresponding reduction in gain.

SUMMARY OF THE INVENTION

In an illustrative embodiment of the invention, a first and a second amplifier are connected in a push-pull configuration which includes a cross-coupling arrangement between the two amplifiers. The input signal to the circuit is divided into two complementary signal components which are out of phase. The two complementary signal components are individually applied to each of the two amplifiers through separate rectifying means. These rectifying means are identical and conduct when their input signals are a given polarity. Due to the phase relationship of the complementary signal components, regardless of the polarity of the input signal, one of the rectifying means is conductive while the other is nonconductive. Accordingly, if the first amplifier is performing signal amplification, the input signal to the second amplifier is being blocked by the rectifying means in the input circuit of that amplifier. When the input signal changes polarity, the complementary components also change polarity, causing the rectifying means in the signal path leading to the first amplifier to become nonconductive and the rectifying means in the signal path leading to the second amplifier to become conductive. At this time, the second amplifier is performing the signal amplification.

The cross-coupling arrangement combines a portion of the input signal applied to the active amplifier with the output signal of that amplifier to provide an error component produced by noise and distortion introduced into the signal by the active amplifier. The error component is applied to the other amplifier. When the output signals of the amplifiers are combined through the push-pull arrangement, the amplified error component of the other amplifier cancels out the noise and distortion present in the output of the amplifier which is amplifying a complementary signal component. The feed-forward compensation not only substantially eliminates the noise and distortion of the amplifier, but also has the ability to eliminate any slight amount of nonlinearity incurred by the use of the rectifying means. The push-pull arrangement provides the well-known advantages of push-pull amplification while the combination of the rectifying means and the cross-coupling arrangement provides feed-forward compensation to eliminate substantially noise and distortion without requiring additional subsidiary amplifiers.

It is a feature of the invention that the rectifying means and the cross-coupling arrangement in a push-pull amplifier provide feed-forward compensation without requiring additional amplifiers.

This and other features of the invention will become apparent upon consideration of the following detailed description taken in conjunction with the accompanying drawing.

BRIEF DESCRIPTION OF THE DRAWING

The FIGURE is a block diagram of an embodiment of the present invention.

DETAILED DESCRIPTION

In the Figure, feed-forward amplifier 10 embodying the principles of the present invention is shown in a block diagram. The analog input signal is applied to an input terminal 11 of a power splitter 12. The power splitter or divider 12 divides the input signal into two complementary components which are 180° out of phase and equal in magnitude. The various components of the feed-forward amplifier 10 which perform signal splitting, and which add or subtract the different signals in the circuit may be realized, for example, by suitable transformers or other means known in the art. One complementary component is applied to a signal path 17 through a conductor 13. The other complementary signal component is applied to a signal path 18 through a conductor 14. The signal path 17 comprises, connected in cascade, a power divider 21, a rectifying means 23, an adder 27, an amplifier 29 and a power divider 31. The output signals of power dividers 21 and 31 are applied to a subtractor 33. The signal path 18 comprises, connected in cascade, a power divider 22, a rectifying means 24, an adder 26, an amplifier 28 and a power divider 32. The output signals of power dividers 22 and 32 are applied to a subtractor 34. In addition, a pair of gates 36 and 37 are connected by a conductor 39 to the power splitter 12. The output signal from the subtractor 33 is applied to the gate 37 whose output signal is applied to the adder 26. The output signal of the subtractor 34 is applied to the gate 36 whose output signal is applied to the adder 27. The adder 41 receives the output signals from amplifiers 29 and 28 through power dividers 31 and 32. The output signal from the circuit is obtained from an output terminal 42 of the adder 41.

In operation, the analog input signal is applied to the input terminal 11 and split up into two complementary components by the power splitter 12. When the complementary signal component applied to the rectifying means 23 through the power divider 21 is positive in polarity, means 23 becomes conductive and allows the complementary signal component to pass through the signal path 17. In the signal path 17, the complementary signal component passes through the adder 27 before being amplified by the amplifier 29. The output signal from the amplifier 29 is applied to the power divider 31. The power divider 31 passes the major portion of the output signal from the amplifier 29 on to the adder 41. In a like manner, when the complementary signal component applied to the rectifying means 24 through the power divider 22 is positive in polarity, it is allowed to pass through the various components in signal path 18 in the same manner as was described for the components of signal path 17. The output signal from the final component in signal path 18 is obtained from the power divider 32 which passes the major portion of the output from the amplifier 28 on to the adder 41. Since the rectifying means 23 and 24 are conductive for signals of positive polarity and the complementary signal components applied to them are opposite in polarity, the signal amplification described in signal paths 17 and 18 alternates with changes in polarity of the input signal applied to the input terminal 11.

To facilitate an understanding of the operation of the feed-forward amplifier 10, the characteristics of the components shall now be explained. The amplifiers 28 and 29 are substantially identical and have the same gain. Both amplifiers 28 and 29 supply an output signal which is in phase with their respective input signals. To realize desirable characteristics for purposes of the invention, amplifiers 28 and 29 are biased for class AB operation. This class of operation enables amplifiers 28 and 29 to amplify positive signals of a large magnitude and negative signals of a small magnitude. Therefore, error component signals which are small in magnitude can be amplified faithfully since amplifiers 28 and 29, in this case, are operated linearly. Furthermore, power dividers 21 and 31 in the signal path 17 are respectively identical to power dividers 22 and 32 in the signal path 18.

During operation when the rectifying means 21 is conductive, the amplifier 29 is providing power gain on its positive input signal. Under this condition, portions of the input and output signals of the amplifier 29 are applied to the subtractor 33 by power dividers 21 and 31. These power dividers are designed to provide output signals for the subtractor 33 which have substantially the same magnitude. The subtractor 33 subtracts the signal abstracted by the power divider 21 from the signal abstracted by the power divider 31. Aside from the unilateral conduction and a slight amount of nonlinearity introduced by rectifying means 23 during conduction, the positive portion of the waveform amplified in the amplifier 29 is also changed by the noise and distortion introduced by that amplifier. As a result, the output signal from the subtractor 33 is the difference in the two waveforms produced by the combined effect of rectifying means 23 and amplifier 29. The positive portion of the output signal from the subtractor 33 is the error component signal which is used to provide the feed-forward compensation. The negative portion of the output signal from the subtractor 33 is of no value and is discarded as shall be explained in accordance with the following discussion of the operation of the gate 37.

The output of the subtractor 33 is applied to gate 37. The gate 37 is enabled only when the complementary signal component applied to it from the power splitter 12 through the conductor 39 is positive in polarity. When the complementary signal component is negative, gate 37 is disabled and the negative portion of the output from the subtractor 33 is blocked off. When the gate 37 is enabled, its output signal is applied to the adder 26 in the signal path 18 which is isolated from the application of the negative complementary signal component by the rectifying means 23. Therefore, this signal is the only signal applied to the adder 26 and passes directly on to the amplifier 28. Since this signal has a smaller amplitude than the amplitude of the complementary signal components, its negative and positive excursions are faithfully amplified by amplifier 28. The output signal from the amplifier 28 is applied to the adder 41. This output signal, which is primarily an amplified version of the noise and distortion present in the output of the amplifier 29, is amplified to the same level as the noise and distortion originally present in the output of the amplifier 29. The error component signal from the amplifier 28 and the output signal from amplifier 29 are combined in the adder 41. More specifically, the two signals are in phase and the adder 41 inverts the output of the signal path 18 and combines it with the output of the signal path 17. The resultant output signal from the adder 41 is stripped of noise and distortion introduced by the amplifier 29 due to the cancellation produced by the error component from the amplifier 28.

When the input signal changes in polarity, the amplifier 28 in the signal path 18 amplifies the positive complementary signal component. Signal dividers 22 and 32 supply signals to the subtractor 34 which provides the error component introduced by the amplifier 28 and rectifying means 24. This error component is applied to the gate 36 which is enabled by the negative complementary signal component from the power splitter 12 through the conductor 39. Therefore, the amplifier 29 amplifies the error component which is applied to the adder 41. The adder 41 functions the same as before to produce the desired cancellation, but now the main signal and the error component applied to its inputs are opposite from what they were before the input signal changed in polarity. In this case, the noise and distortion introduced by the amplifier 28 and any slight nonlinearity produced by rectifying means 24 are eliminated from the output signal of the adder 41.

In all cases, it is to be understood that the foregoing arrangement is merely illustrative of the many possible applications of the feed-forward principles of the invention. Numerous and varied other feed-forward arrangements in accordance with these principles may readily be devised by those skilled in the art without departing from the spirit and scope of the invention.

What is claimed is:

1. A feed-forward amplifier for electrical signals comprising:

a first power divider for dividing the input signal into two complementary signal components of opposite phase and for coupling one of said two complementary signal components to a first signal path and the other of said complementary signal components to a second signal path;

said first signal path including, in cascade, a first rectifying means and a first amplifier, said first rectifying means completing a conductive path for applying the one complementary signal component to said first amplifier when the input signal is one polarity;

said second signal path including, in cascade, a second rectifying means and a second amplifier, said second rectifying means completing a conductive path for applying the other complementary signal component to said second amplifier when the input signal is the opposite polarity;

first means for combining a portion of the input signal and a portion of the output signal of said first amplifier to obtain a first error component and means for applying the first error component to said second amplifier;

second means for combining a portion of the input signal and a portion of the output signal of said second amplifier to obtain a second error component and means for applying the second error component to said first amplifier;

and means for inverting the signal from one of said amplifiers and for combining the output signals from said first and second amplifiers such that the error component of the output signal resulting from amplifying one of said complementary signal components in one of said amplifiers is canceled by the amplified error component output of the other of said amplifiers to produce an output signal substantially free of error components.

2. The feed-forward amplifier of claim 1 wherein said first means for combining comprises:

first and second signal dividers, said first signal divider abstracting a portion of the input signal of said first amplifier and said second signal divider abstracting a portion of the output signal of said first amplifier;

and a first subtractor for subtracting the portion of the input signal from the portion of the output signal of said first amplifier to obtain the first error component.

3. The feed-forward amplifier of claim 1 wherein said second means for combining comprises:

third and fourth signal dividers, said third signal divider abstracting a portion of the input signal of said second amplifier and said fourth signal divider abstracting a portion of the output signal of said second amplifier;

and a second subtractor for subtracting the portion of the input signal from the portion of the output signal of said second amplifier to obtain the second error component.

4. The feed-forward amplifier of claim 2 wherein said means for applying the first error component to said second amplifier comprises a first gate connected to said first subtractor and a first adder connected to the input of said second amplifier, said first gate being enabled when the one complementary signal component is applied to said first amplifier, and said first gate supplying the first error component to said second amplifier through said first adder.

5. The feed-forward amplifier of claim 3 wherein said means for applying the second error component to said first amplifier comprises a second gate connected to said second subtractor and a second adder connected to the input of said first amplifier, said second gate being enabled when the other complementary signal component is applied to said second amplifier, and said second gate supplying the second error component to said first amplifier through said second adder.

* * * * *

UNITED STATES PATENT OFFICE
CERTIFICATE OF CORRECTION

Patent No. 3,693,109 Dated September 19, 1972

Inventor(s) Richard Barry Swerdlow

It is certified that error appears in the above-identified patent and that said Letters Patent are hereby corrected as shown below:

Front page, data element identifier [45] delete "Sept. 12, 1972" and substitute therefor --Sept. 19, 1972--.

Signed and sealed this 8th day of May 1973.

(SEAL)
Attest:

EDWARD M.FLETCHER,JR.
Attesting Officer

ROBERT GOTTSCHALK
Commissioner of Patents